(12) United States Patent
Penumatcha et al.

(10) Patent No.: US 10,886,286 B2
(45) Date of Patent: Jan. 5, 2021

(54) VERTICAL MEMORY CONTROL CIRCUITRY LOCATED IN INTERCONNECT LAYERS

(71) Applicant: Intel Corporation, Santa Clara, CA (US)

(72) Inventors: Ashish Verma Penumatcha, Hillsboro, OR (US); Daniel H. Morris, Hillsboro, OR (US); Uygar E. Avci, Portland, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 13 days.

(21) Appl. No.: 16/146,938

(22) Filed: Sep. 28, 2018

(65) Prior Publication Data

US 2020/0105774 A1    Apr. 2, 2020

(51) Int. Cl.
| | |
|---|---|
| *H01L 27/11514* | (2017.01) |
| *H01L 27/11509* | (2017.01) |
| *G11C 11/22* | (2006.01) |
| *H01L 25/18* | (2006.01) |
| *H01L 23/532* | (2006.01) |
| *H01L 23/528* | (2006.01) |

(52) U.S. Cl.
CPC ...... *H01L 27/11514* (2013.01); *G11C 11/221* (2013.01); *G11C 11/2255* (2013.01); *G11C 11/2257* (2013.01); *G11C 11/2259* (2013.01); *G11C 11/2273* (2013.01); *H01L 23/528* (2013.01); *H01L 23/5329* (2013.01); *H01L 25/18* (2013.01); *H01L 27/11509* (2013.01)

(58) Field of Classification Search
None
See application file for complete search history.

(56) References Cited

U.S. PATENT DOCUMENTS

| | | | |
|---|---|---|---|
| 2018/0061468 A1* | 3/2018 | Derner | G11C 11/221 |
| 2018/0122478 A1 | 5/2018 | Morris et al. | |

FOREIGN PATENT DOCUMENTS

WO    2018125024 A1    7/2018

OTHER PUBLICATIONS

Cutress, "Intel and Micron to Dissolve 3D XPoint Partnership after 2019", AnandTech, Jul. 16, 2018, three pages, https://www.anandtech.com/show/13083/intel-and-micron-update-3d-xpoint-roadmap-combined-effort-2nd-gen-3rd-gen-separate.

(Continued)

*Primary Examiner* — Raj R Gupta
(74) *Attorney, Agent, or Firm* — Trop, Pruner & Hu, P.C.

(57) ABSTRACT

An embodiment includes a substrate having a surface; a first layer that includes a metal and is on the substrate; a second layer that includes the metal and is on the first layer; a first switching device between the first and second layers; a second switching device between the first and second layers; a capacitor between the first and second layers, the capacitor including ferroelectric materials; a memory cell that includes the first switching device and the capacitor; an interconnect line that couples the first and second switching devices to each other; wherein: (a) the surface is substantially disposed in a first plane, and (b) a second plane is parallel to the first plane, the second plane intersecting the first and second switching devices. Other embodiments are addressed herein.

25 Claims, 8 Drawing Sheets

(56) References Cited

OTHER PUBLICATIONS

Micheloni et al., "Architectural and Integration Options for 3D NAND Flash Memories", Computers, Aug. 10, 2017, pp. 1-19, vol. 6 Issue 3, MDPI AG, Basel, Switzerland.
Wikipedia, "Charge trap flash", May 30, 2018, nine pages, https://en.wikipedia.org/wiki/Charge_trap_flash.
Wikipedia, "Thin-film transistor", Jun. 28, 2018, three pages, https://en.wikipedia.org/wiki/Thin-film_transistor.
Wikipedia, "System in package", Jun. 29, 2018, two pages, https://en.wikipedia.org/wiki/System_in_package.
Wikipedia, "Package on package", Jun. 24, 2018, four pages, https://en.wikipedia.org/wiki/Package_on_package.
Wikipedia, "Ferroelectric RAM", Aug. 21, 2018, six pages, https://en.wikipedia.org/wiki/Ferroelectric_RAM.
Wikipedia, "Ferroelectricity", Jul. 1, 2018, seven pages, https://en.wikipedia.org/wiki/Ferroelectricity.
Wikipedia, "Flash memory", Aug. 28, 2018, 23 pages, https://en.wikipedia.org/wiki/Flash_memory.
Das, "Intel's Embedded DRAM: New Era of Cache Memory", EE Times, Aug. 7, 2014, six pages, https://www.eetimes.com/author.asp?doc_id=1323410.
James, "The Confab—Semi Industry is Now Mature", Solid State Technology, Dec. 6, 2013, 49 pages, https://electroiq.com/chipworks_real_chips_blog/author/sdavis/page/3/.
James, "Recent Innovations in DRAM Manufacturing", Conference Paper, Aug. 2010, seven pages, Chipworks, Inc.
Tallis, "Micron 3D NAND Status Update", AnandTech, Feb. 12, 2016, four pages, https://www.anandtech.com/show/10028/micron-3d-nand-status-update.
Sheldon, "NAND flash memory basics: Comparing SLC, MLC and TLC NAND", Tech Target, Nov. 20, 2017, three pages, https://searchstorage.techtarget.com/feature/NAND-flash-memory-basics-Comparing-SLC-MLC-and-TLC-NAND.
Walker, "Samsung's 3D V-NAND Flash Product—The Spires of El Dorado?", 3D InCites, Aug. 12, 2014, two pages, https://www.3dincites.com/2014/08/samsungs-3d-vnand-flash-product-spires-el-dorado/.
Tai et al., "Photosensitivity Analysis of Low-Temperature Poly-Si Thin-Film Transistor Based on the Unit-Lux-Current", IEEE Transactions on Electron Devices, Jan. 2009, pp. 50-56, vol. 56, No. 1, Institute of Electrical and Electronics Engineers.
Alcorn, "WD's Big Advantage: BiCS3 64-Layer 3D NAND Coming This Year", Tom's Hardware, Jul. 26, 2016, three pages, https://www.tomshardware.com/news/wd-sandisk-bics3-64-layer-3d-nand,32328.html.
Polinksy, "Dynamic Random Access Memory—DRAM", Introduction to DRAM Technology, Aug. 28, 2001, 36 pages, Rochester Institute of Technology—Microelectronic Engineering.

* cited by examiner

VERTICAL MEMORY CONTROL CIRCUITRY LOCATED IN INTERCONNECT LAYERS

TECHNICAL FIELD

Embodiments of the invention are in the field of semiconductor devices and, in particular, memory.

BACKGROUND

Once semiconductor wafers are prepared, a large number of process steps are still necessary to produce desired semiconductor integrated circuits. In general the steps can be grouped into four areas: Front End Processing, Back End Processing, Test, and Packaging.

Front end processing (sometimes referred to as "frontend") refers to the initial steps in the fabrication. In this stage semiconductor devices (e.g., transistors) may be created in a wafer. For example, a front end process may include: preparation of the wafer surface, patterning and subsequent implantation of dopants to obtain desired electrical properties, growth or deposition of a gate dielectric, and growth or deposition of insulating materials to isolate neighboring devices.

Once the front end semiconductor devices have been created they may be interconnected to form electrical circuits. This "Back End Processing" (sometimes referred to as "backend") involves depositing various layers of metal and insulating material in the desired pattern. Typically the metal layers consist of aluminum, copper, and the like. The insulating material may include oxides, low-K materials, and the like. The various metal layers are interconnected by interconnects, which may include a line portion (sometimes referred to as a trace or wire) and a via portion. Vias may be formed by etching holes in the insulating material and depositing metal (e.g., Tungsten) in them. The line portion may be formed by etching trenches in the insulating material and depositing metal in them.

Once the back end processing has been completed, the semiconductor devices are subjected to a variety of electrical tests to determine if they function properly. Finally, the wafer is cut into individual die, which are then packaged in packages (e.g., ceramic or plastic packages) with pins or other connectors to other circuits, power sources, and the like.

The back end is increasingly being used for far more than interconnect routing. For example, memory cells are now being formed within the backend layers to increase the density of memory arrays. In other words, multiple tiers of memory arrays can be stacked upon each other to obtain higher memory density.

BRIEF DESCRIPTION OF THE DRAWINGS

Features and advantages of embodiments of the present invention will become apparent from the appended claims, the following detailed description of one or more example embodiments, and the corresponding figures. Where considered appropriate, reference labels have been repeated among the figures to indicate corresponding or analogous elements.

DETAILED DESCRIPTION

Figure 1:
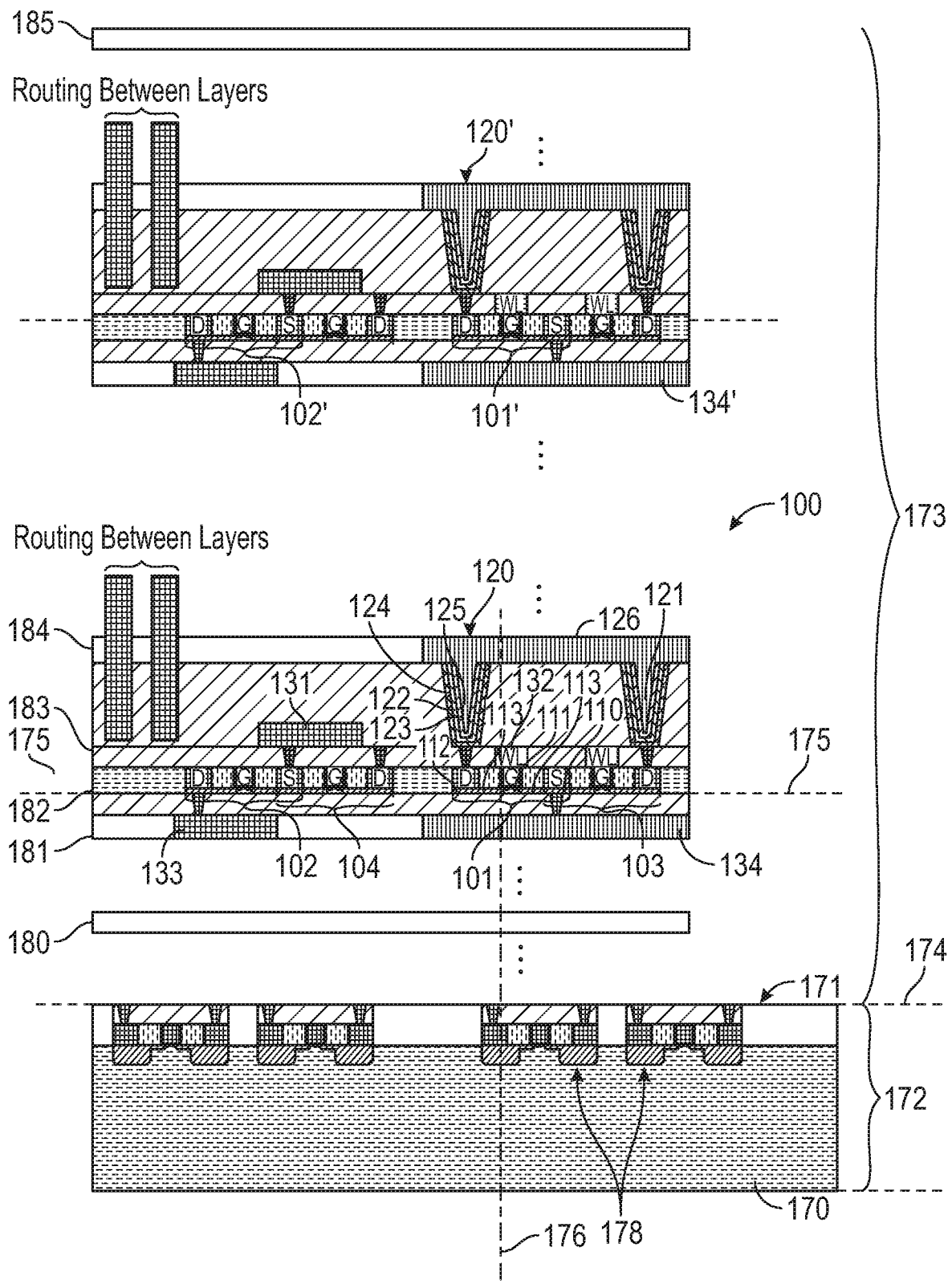
FIG. 1 includes a memory system in an embodiment.

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments (e.g., walls may not be exactly orthogonal to one another in actual fabricated devices). Moreover, the drawings may only show the structures useful to understand the illustrated embodiments. Additional structures known in the art may not have been included to maintain the clarity of the drawings. For example, not every layer (e.g., barrier layer, seed layer, etch stop layer) of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements cooperate or interact with each other, but they may or may not be in direct physical or electrical contact.

As mentioned above, memory cells are now being stacked upon each other within the backend layers to increase memory density. However, Applicant determined that to increase memory density even further designers must vertically stack the memory cells (sometimes referred to as bit cells) as well as peripheral logic circuits that control those memory cells.

Such peripheral circuitry may include multiplexors (MUX). A MUX is a device that selects, for example, one of several input signals and forwards the selected input signal. Multiplexers are mainly used to increase the amount of data that can be sent over the network within a certain amount of time and bandwidth. A multiplexer may also be called a data selector. For memory control circuitry, a MUX may be used as a form of addressing circuit used to address memory cells. Addressing circuits include X decoders, Y decoders, word line drivers, bit line drivers, and the like. Other forms of peripheral circuitry for memory includes sense amplifiers, pre-charge circuits, and the like.

Such peripheral circuits make up nearly 30% of the memory area for a single array. If these peripheral circuits are formed in the front end, extra area on the silicon wafer (the front end) must be used for the peripheral circuits. This may increase the overall size of the memory system. However, embodiments address this issue by locating one or more portions of memory control circuitry in the back end. Such embodiments may include back end transistors. These back end transistors may be used not only in the memory control circuits (e.g., MUX) but also in the back end memory cells. Such cells include, for example, 1T-1C cells that include one back end transistor and one back end capacitor. Such capacitors may include ferroelectric materials. As a result, the ferroelectric capacitors provide stable data storage, which in turn provides relaxed design space. For example, the restraints of arranging memory cells with respect to one another are relaxed because data loss due to interference between cells (and the word lines that help operate the cells) is less likely to occur with ferroelectric-based memory.

Ferroelectric memory refers to a memory technology employing ferroelectric materials. A ferroelectric material is a material that exhibits, over some range of temperatures, a spontaneous electric polarization (i.e., displacement of positive and negative charges from their original position), that can be reversed or reoriented by application of an electric field. Because the displacement of the charges in ferroelectric materials can be maintained for some time even in the absence of an electric field, such materials may be used to implement memory cells. A ferroelectric material may include anti-ferroelectric materials as well.

Embodiments using ferroelectric memories provide adequate non-volatility, short programming time, low power consumption, high endurance, and high speed writing. In addition, such embodiments may be manufactured using processes compatible with the standard complementary metal-oxide-semiconductor (CMOS) technology.

A ferroelectric memory system disclosed herein includes 1T-1C memory cell. An access transistor of the cell may include a back end transistor that is coupled to the ferroelectric capacitor by sharing its source/drain terminal with one electrode of the ferroelectric capacitor and is used for both READ and WRITE access to the ferroelectric capacitor. The ferroelectric material employed in the ferroelectric capacitor may include, for example, materials exhibiting ferroelectric behavior at thin dimensions, such as hafnium zirconium oxide (HfZrO, also referred to as HZO, which includes hafnium, zirconium, and oxygen), silicon-doped (Si-doped) hafnium oxide (which is a material that includes hafnium, oxygen, and silicon), germanium-doped (Ge-doped) hafnium oxide (which is a material that includes hafnium, oxygen, and germanium), aluminum-doped (Al-doped) hafnium oxide (which is a material that includes hafnium, oxygen, and aluminum), yttrium-doped (Y-doped) hafnium oxide (which is a material that includes hafnium, oxygen, and yttrium), lead zirconate titanate (which is a material that includes lead, zirconium, and titanium), barium zirconate titanate (which is a material that includes barium, zirconium and titanium), and combinations thereof. Some embodiments include hafnium, zirconium, barium, titanium, and/or lead, and combinations thereof.

While many embodiments address locating some portion of peripheral memory circuitry in the back end, other portions of the peripheral memory circuity may be located in the front end. Such front end circuity (e.g., sense amplifier) may be located below the memory array and/or back end memory control circuitry (e.g., MUX) to reduce the overall size of the wafer substrate used for the front end and/or allow the front end area typically used for memory peripheral circuitry to be used for other purposes (e.g., a processor). Many vias are used to interconnect front end devices (e.g., transistors in a sense amplifier) to back end devices (e.g., memory cells and/or MUX).

Thus, embodiments described herein provide advantages by locating peripheral circuitry (that would otherwise be in the front end) in the backend. By doing so this reduces the need to route word lines and/or bit lines from the back end to the front end. This reduction in routing reduces the layout complexity for interconnect structures within the back end. Improvements are not limited to reduction of front end space and alleviating routing complexity of word lines and bit lines. Advantages also include, for example, the use of NMOS-only backend transistors and contact structures for the back end control circuits and memory cells. For example, transistors for the MUX and the memory cell access transistor may be located within the same interconnect level of the back end and may both be NMOS (thereby reducing the manufacturing steps needed to produce CMOS circuitry within a single interconnect layer). The NMOS back end circuits can be made simultaneously with the transistor of the 1T-1C without incurring extra cost (e.g., few or no additional masks and few or no additional process steps). In another example, transistors for the MUX and the memory cell access transistor may be located within the same interconnect level of the back end and may both be PMOS (thereby reducing the manufacturing steps needed to produce CMOS circuitry within a single interconnect layer).

FIG. 1 includes a memory system 100 in an embodiment. System 100 comprises a substrate 170 having a surface 171. Substrate 170 may constitute a front end 172 located below a back end 173 that includes layers. Such layers may also be referred to as "metal layers" or "interconnect layers" in some embodiments or, more generally, layers. Backend layers include, for example, layers 180, 181, 182, 183, 184, 185. Front end 172 may include transistors 178 or, in other embodiments, may omit transistors and provide more of a supporting role such as a package substrate.

A first layer 181 (or layer 180 in other embodiments) includes a metal, the first layer 181 being on the substrate 170. A second layer 185 includes the same metal as layer 181. The second layer 185 is on the first layer 181. A first switching device 101 is between the first and second layers 181, 185. The first switching device 101 comprises a first source region 110 (where first source region 110 is directly below the source contact that is labeled "S"), a first channel region 111 (where channel region 111 is directly below gate labeled "G" and gate dielectric layer that is not labeled for sake of clarity), and a first drain region 112 (where first drain region 112 is directly below drain contact that is labeled "D"). Switching device 101 may be a thin film transistor (TFT) that includes areas of doping 113 that differ from the doping of regions 110, 112. However, embodiments are not limited to TFTs. For instance, transistors based on a change in material composition under the source and drain form an n-undoped-n structure.

A thin film transistor (TFT) may include a field effect transistor implemented using thin film technology. The thin films may include, for example, films of polycrystalline or amorphous silicon, transition metal dichalcogenide (TMD) monolayers, compound semiconductors (e.g., cadmium selenide), metal oxides (e.g., zinc oxide, hafnium oxide), and a variety of insulating substrates. More specifically, a TFT may include a special kind of metal-oxide-semiconductor field effect transistor (MOSFET) made by depositing thin films of an active semiconductor layer as well as metallic contacts over a supporting substrate. TFTs differ from conventional MOSFETs because the semiconductor material (and channel) of conventional MOSFETs is typically the substrate, such as a silicon wafer (instead of a thin film as is the case with a TFT). While TFTs 101, 102, 103, 104 are shown with a specific architecture (e.g., gate, source, and drain contacts all on the semiconductor materials) other TFT architectures (e.g., where gate and source/drain contacts are on opposite sides of semiconductor layer and/or where gate and drain/source contacts are on opposite sides of semiconductor layer) may be used while still providing for an embodiment where stacked memory (e.g., DRAM, MRAM, RRAM) has a portion of its peripheral circuitry (e.g., MUX) located in the back end layers.

System 100 may include other switching devices such as TFTs 102, 103, 104. Switching device 102, for example, is between the first and second layers 181, 185 and includes a second source region, a second channel region, and a second drain region similar to device 101.

Capacitor 120 is between the first and second layers 181, 185. Capacitor 120 may be a ferroelectric capacitor and include ferroelectric materials that include oxygen and at least one of hafnium, zirconium, barium, titanium, lead, and combinations thereof. The ferroelectric materials 122 may be between metal or conductor layer 123 and metal or conductor layer 124. Metal filling 125 may couple to a common capacitor plate 126. Plate 126 is coupled to capacitor 121.

A first memory cell includes the switching device 101 and the capacitor 120. The cell constitutes a 1T-1C memory cell. Another memory cell includes switching device 103 and capacitor 121. Switching device 102 is not included in any memory cell and is instead included in a peripheral circuit such as a MUX or sense amplifier.

An interconnect line may couple the first and second switching devices 101, 102 to each other. For example, an interconnect line 131 may couple device 102 to word line 132 and word line 132 may couple to device 101. For example, an interconnect line 133 may couple device 102 to bit line 134 and bit line 134 may couple to device 101.

In an embodiment bit line 134 is between the first switching device 101 and the substrate 170 and capacitor 120 is between the first switching device 101 and the second layer 185. This provides a "capacitor over bit line" (COB) architecture but other embodiments are not limited in this way and may include, for example, a bit line between the switching device 101 and layer 185. In an embodiment both the bit line and the common capacitor plate may be below their corresponding transistor, such as transistor 101.

Surface 171 is substantially disposed in a first plane 174. Second plane 175 is parallel to the first plane 174. The second plane 175 intersects the first and second switching devices 101, 102. In an embodiment, plane 175 intersects areas 110, 111, 112, 113. Devices 101, 102 are in the same backend layer and may be formed simultaneously thereby providing manufacturing efficiency in terms of cost, time, and complexity. In an embodiment an axis 176 is orthogonal to the first plane 174. Axis 176 intersects the substrate 170, the first layer 181, the first switching device 101, and the second layer 185.

In system 100 word line 132 is between the first switching device 101 and the second layer 185. Thus, in such an embodiment device 102 may include interconnect lines above and below the device, where the lines may couple to word lines, bit lines, and the like. This illustrates an advantage for locating peripheral circuit device 102 in the back end. Specifically, by locating the device 102 in the back end interconnects to the device can be both above and below the device whereas the interconnects would only be above the device if the device were in the frontend.

An embodiment comprises a sense amplifier corresponding to the memory cell (that includes device 101 and capacitor 120) where the sense amplifier includes the second switching device 102. By "corresponding to" the sense amplifier is configured to sense the data of the memory cell (that includes device 101 and capacitor 120) when that cell is properly selected by control circuitry.

However, in another embodiment system 100 includes a MUX that includes the second switching device 102. The MUX is to select one of the first switching device 101 or another switching device (e.g., device 103) when such a device (and corresponding cell) is properly selected.

System 100 may include additional switching devices in layers between layer 182 and layer 185 or within layer 185 or some other backend layer. For example, layer 185 and adjacent layers may be arranged like layers 182, 183, 184 to provide a stacked layer of memory cells and control circuitry (e.g., MUX) similar to layers 182, 183, 184 shown in FIG. 1. Such an additional layer of memory cells may be addressed by a mux including device 102 or some other mux located in system 100, such as within the same back end layer as the access transistor of the additional memory cell. As a brief example whose description is abbreviated for clarity, additional stacks of memory may include a memory cell with capacitor 120' and switching device 101', a MUX may utilize switching device 102', and a bit line 134' may couple to device 101'.

In an embodiment the switching devices 101, 102 are both NMOS transistors and layer 182 does not include a PMOS transistor. As a result, manufacturing is simplified by avoiding CMOS procedures. In an embodiment the switching devices 101, 102 are both PMOS transistors and layer 182 does not include an NMOS transistor. As a result, manufacturing is simplified by avoiding CMOS procedures. Further, the transistors 101, 102 may be the same type of transistor. For example, not only are transistors 101, 102 NMOS, but they may also include the same gate dielectric material and the same channel semiconductor material.

While 1T-1C memory cells are shown in FIG. 1, in other embodiments memory cells are not limited in that way and the memory cells may include a component in addition to the one transistor and one capacitor. The "additional component" may include at least one of an additional capacitor or an additional switching device such that embodiments include memory cells that are not 1T-1C but may have multiple transistors, capacitors, and/or transistors and capacitors.

Figure 2:
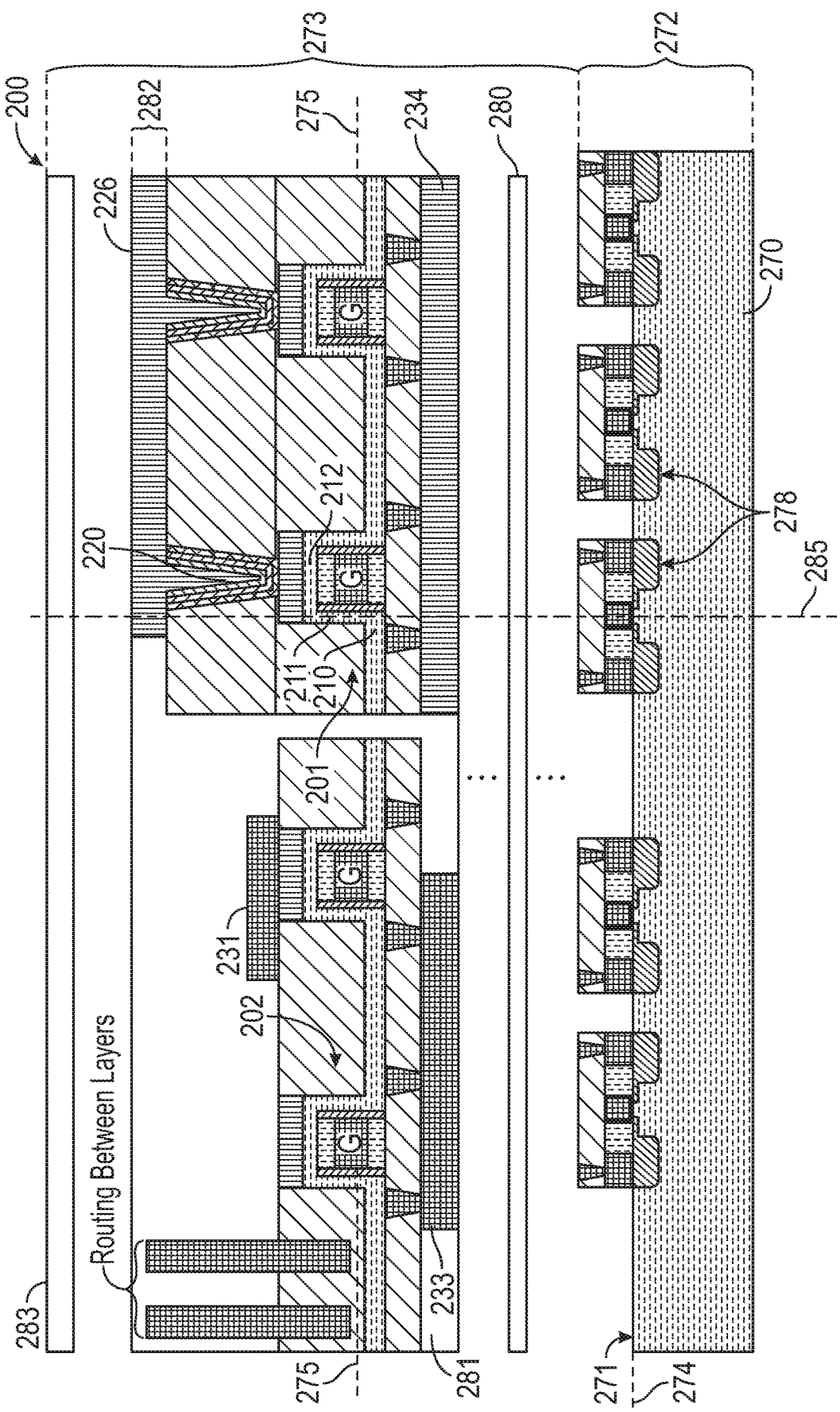
FIG. 2 includes a memory system in an embodiment.

FIG. 2 includes memory system 200 in an embodiment. System 200 comprises a substrate 270 having a surface 271. Substrate 270 may constitute a front end 272 located below a back end 273 that includes layers. Backend layers include, for example, layers 280, 281, 282, 283. Front end 272 may include transistors 278 or, in other embodiments, may omit transistors and provide more of a supporting role such as a package substrate.

A first layer 280 includes a metal. A second layer 283 includes the same metal as layer 280. A first switching device 201 is between the first and second layers 280, 283. The first switching device 201 comprises a first source/drain region 210, a first channel region 211, and a first drain/source region 212. Switching device 201 may be a vertically oriented back end transistor. In an embodiment this device is a TFT with a film that may be deposited or grown to conformally coat the non-planar geometry.

System 200 may include other switching devices (some of which are shown but not labeled in FIG. 2). Switching device 202 includes a second source region, a second channel region, and a second drain region similar to device 201.

Capacitor 220 may be a ferroelectric capacitor and include ferroelectric materials that include oxygen and at least one of hafnium, zirconium, barium, titanium, lead, and combinations thereof. Capacitor 220 may couple to a common capacitor plate 226.

A first memory cell includes the switching device 201 and the capacitor 220. The cell constitutes a 1T-1C memory cell. Switching device 202 is not included in any memory cell and is instead included in a peripheral circuit such as a MUX or sense amplifier.

An interconnect line may couple the first and second switching devices 201, 202 to each other. For example, an interconnect line 231 may couple device 202 to the memory cell including device 201. For example, an interconnect line 233 may couple device 202 to bit line 234 and bit line 234 may couple to device 201.

Surface 271 is substantially disposed in a first plane 274. Second plane 275 is parallel to the first plane 274. The second plane 275 intersects the first and second switching devices 201, 202. Devices 201, 202 are in the same backend layer or layers and may be formed simultaneously thereby providing manufacturing efficiency in terms of cost and time and complexity. In an embodiment an axis 285 is orthogonal to plane 274 and intersects the channel and at least one of the source or drain of device 201.

While not shown, system 200 may include a stack of multiple layers of memory cells such as the cell including device 201 and capacitor 220.

Figure 3:
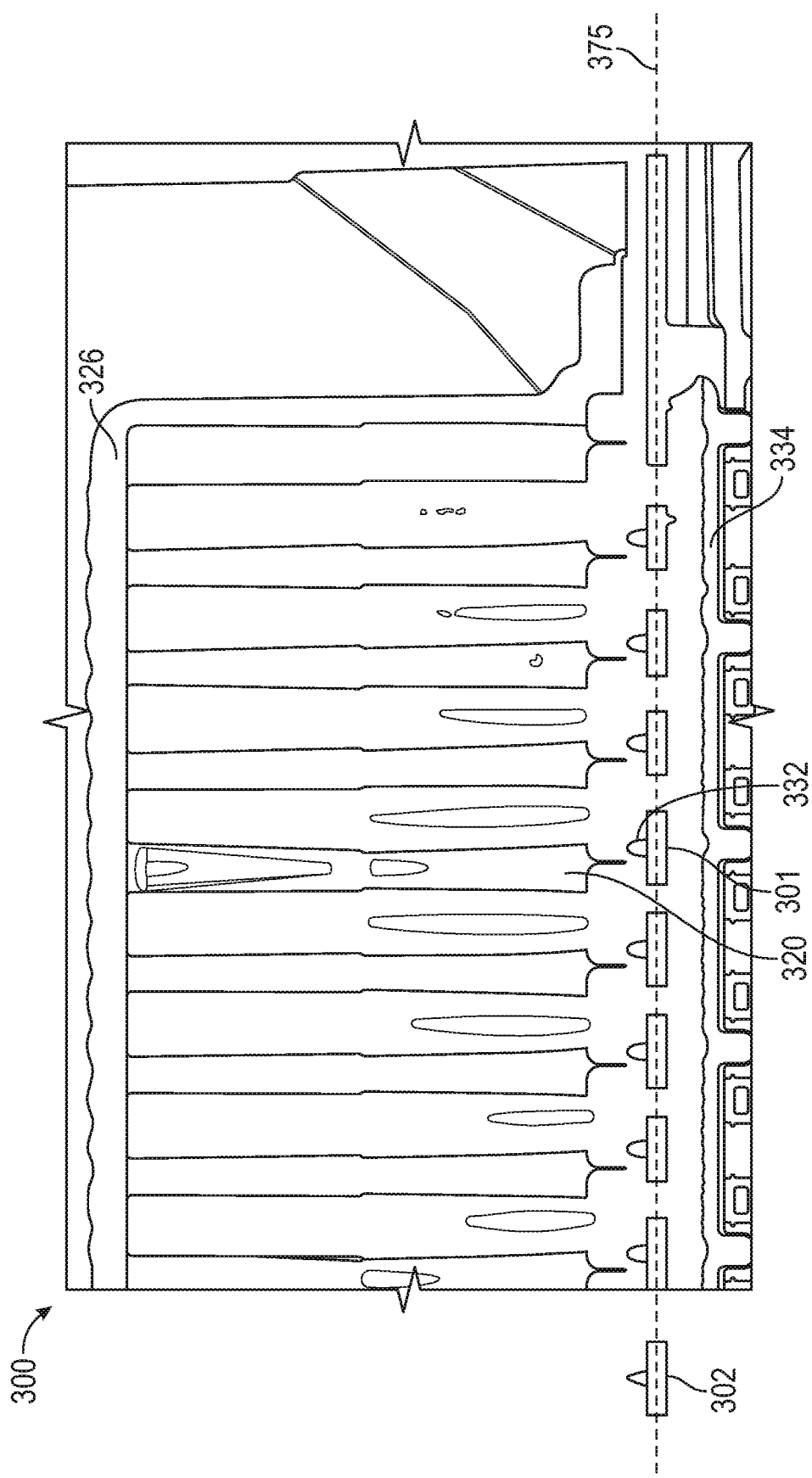
FIG. 3 includes an abstracted representation of an image of memory system in an embodiment.

FIG. 3 includes an abstracted representation of an image of a memory system in an embodiment. Similar to FIG. 1, FIG. 3 includes a memory system 300 that includes a memory cell including capacitor 320 and switching device 301. Word line 332 couples to the gate of the device 301. Bit line 334 is between the substrate (not shown) and device 301. Capacitor 320 couples to a common capacitor plate 326. Another switching device 302 is included at the same level as device 301. In other words, plane 375 intersects devices 301, 302. Device 302 may be included in peripheral circuity, such as a MUX, that is coupled to the memory cell that includes device 301.

Figure 4:
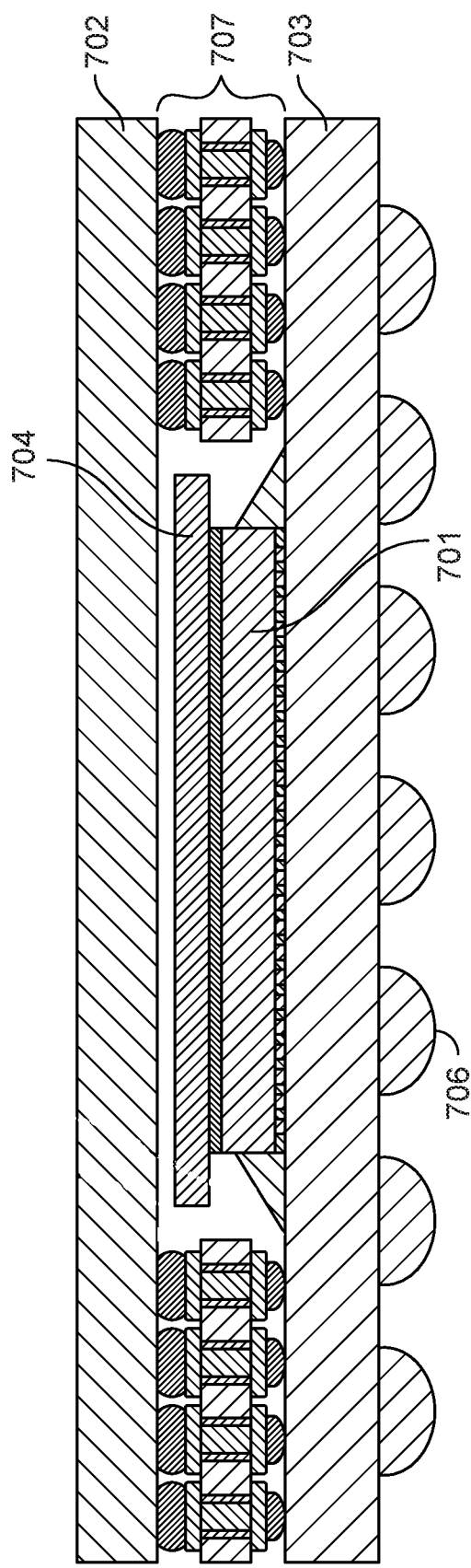
FIGS. 4, 5, 6, 7 include systems that include embodiments.

FIG. 4 includes a package system in an embodiment. The system includes a processor die 701 (a first package) on a package substrate 703. A memory die (a second package) 702 couples to the substrate 703 by way of interposer system 707. Underfill material exists between die 701 and substrate 703. Substrate 703 may include controlled collapse chip connection (C4) interconnects 706. Further, to prevent warping of die 701, die 701 may couple to a metal stiffener 704. Die 701 may include a die stack (e.g., multiple dies which may have the same function or differing functions) that may be molded as one unit that functions as a single die. For example, one die of the stack may have a first logic function while another die of the stack has another logic function that differs from the first logic function.

In the embodiment of FIG. 4, die 701 includes the vertical memory of any of FIGS. 1-3. In another embodiment die 702 includes the vertical memory of any of FIGS. 1-3. In an embodiment die 701 includes the vertical memory of any of FIGS. 1-3 and die 702 includes the vertical memory of any of FIGS. 1-3.

In an embodiment element 704 is not a stiffener but instead is a heat spreader (or is both a stiffener and a heat spreader). A heat spreader is a heat exchanger that moves heat between a heat source and a secondary heat exchanger whose surface area and geometry are more favorable than the source. Such a spreader may be a plate made of copper, which has a high thermal conductivity. By definition, heat is "spread out" over this geometry, so that the secondary heat exchanger may be more fully utilized. This has the potential to increase the heat capacity of the total assembly.

Thus, FIG. 4 depicts an integrated circuit, a memory, and a package housing that includes the integrated circuit and the memory. The integrated circuit and/or memory includes the vertical memory of any of FIGS. 1-3. For example, the circuit may be a processor with embedded DRAM (and/or MRAM and/or RRAM and the like) that includes the memory of any of FIGS. 1-3. For example, the circuit may be a field programmable gate array (FPGA) with vertical memory located in the back end or front end of the FPGA. In other embodiments, the memory (in addition to the integrated circuit or instead of the integrated circuit) includes any of the memory of FIGS. 1-3.

Figure 5:
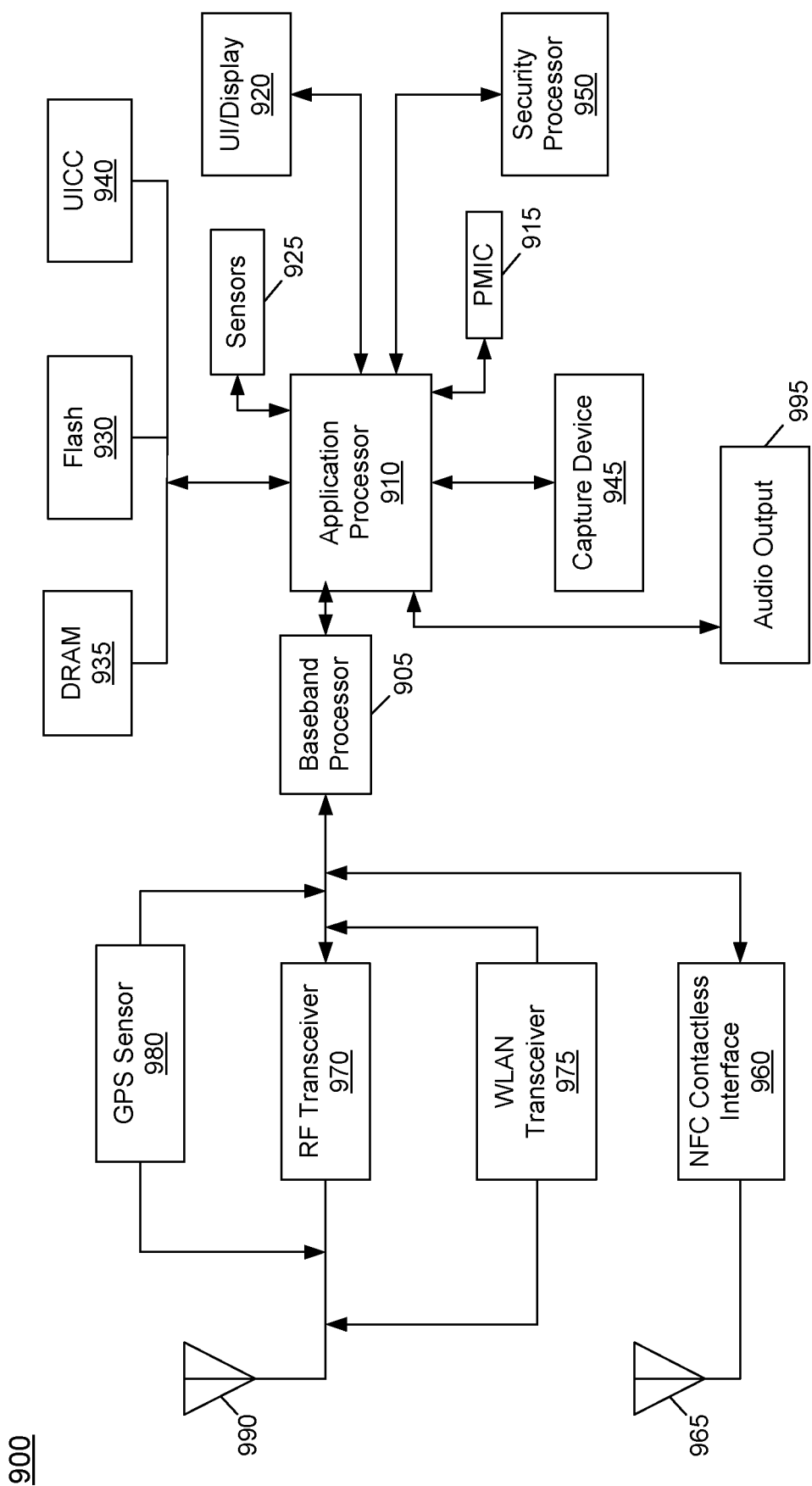

Referring now to FIG. 5, shown is a block diagram of an example system with which embodiments can be used. As seen, system 900 may be a smartphone or other wireless communicator or any other Internet of Things (IoT) device. A baseband processor 905 (which may include any vertical memory described herein) is configured to perform various signal processing with regard to communication signals to be transmitted from or received by the system. In turn, baseband processor 905 is coupled to an application processor 910, which may be a main CPU (which may include any vertical memory described herein) of the system to execute an OS and other system software, in addition to user applications such as many well-known social media and multimedia apps. Application processor 910 may further be configured to perform a variety of other computing operations for the device.

In turn, application processor 910 can couple to a user interface/display 920 (e.g., touch screen display). In addition, application processor 910 may couple to a memory system including a non-volatile memory (which may include any vertical memory described herein), namely a flash memory 930 and a system memory, namely a DRAM 935. As further seen, application processor 910 also couples to audio output 995 and a capture device 945 such as one or more image capture devices that can record video and/or still images.

A universal integrated circuit card (UICC) 940 (which may include any vertical memory described herein) comprises a subscriber identity module, which in some embodiments includes a secure storage to store secure user information. System 900 may further include a security processor 950 (e.g., Trusted Platform Module (TPM)) (which may include any vertical memory described herein) that may couple to application processor 910. A plurality of sensors 925, including one or more multi-axis accelerometers may couple to application processor 910 to enable input of a variety of sensed information such as motion and other environmental information. In addition, one or more authentication devices may be used to receive, for example, user biometric input for use in authentication operations.

As further illustrated, a near field communication (NFC) contactless interface 960 is provided that communicates in a NFC near field via an NFC antenna 965. While separate antennae are shown, understand that in some implementations one antenna or a different set of antennae may be provided to enable various wireless functionalities.

A power management integrated circuit (PMIC) 915 (which may include any vertical memory described herein) couples to application processor 910 to perform platform level power management. To this end, PMIC 915 may issue power management requests to application processor 910 to enter certain low power states as desired. Furthermore, based on platform constraints, PMIC 915 may also control the power level of other components of system 900.

To enable communications to be transmitted and received such as in one or more internet of things (IoT) networks, various circuitry may be coupled between baseband processor 905 and an antenna 990. Specifically, a radio frequency (RF) transceiver 970 and a wireless local area network (WLAN) transceiver 975 may be present. In general, RF transceiver 970 may be used to receive and transmit wireless data and calls according to a given wireless communication protocol such as 3G or 4G wireless communication protocol such as in accordance with a code division multiple access (CDMA), global system for mobile communication (GSM), long term evolution (LTE) or other protocol. In addition a GPS sensor 980 may be present, with location information being provided to security processor 950 for use as described herein when context information is to be used in a pairing process. Other wireless communications such as receipt or transmission of radio signals (e.g., AM/FM) and other signals may also be provided. In addition, via WLAN transceiver 975, local wireless communications, such as according to a Bluetooth™ or IEEE 802.11 standard can also be realized.

Figure 6:
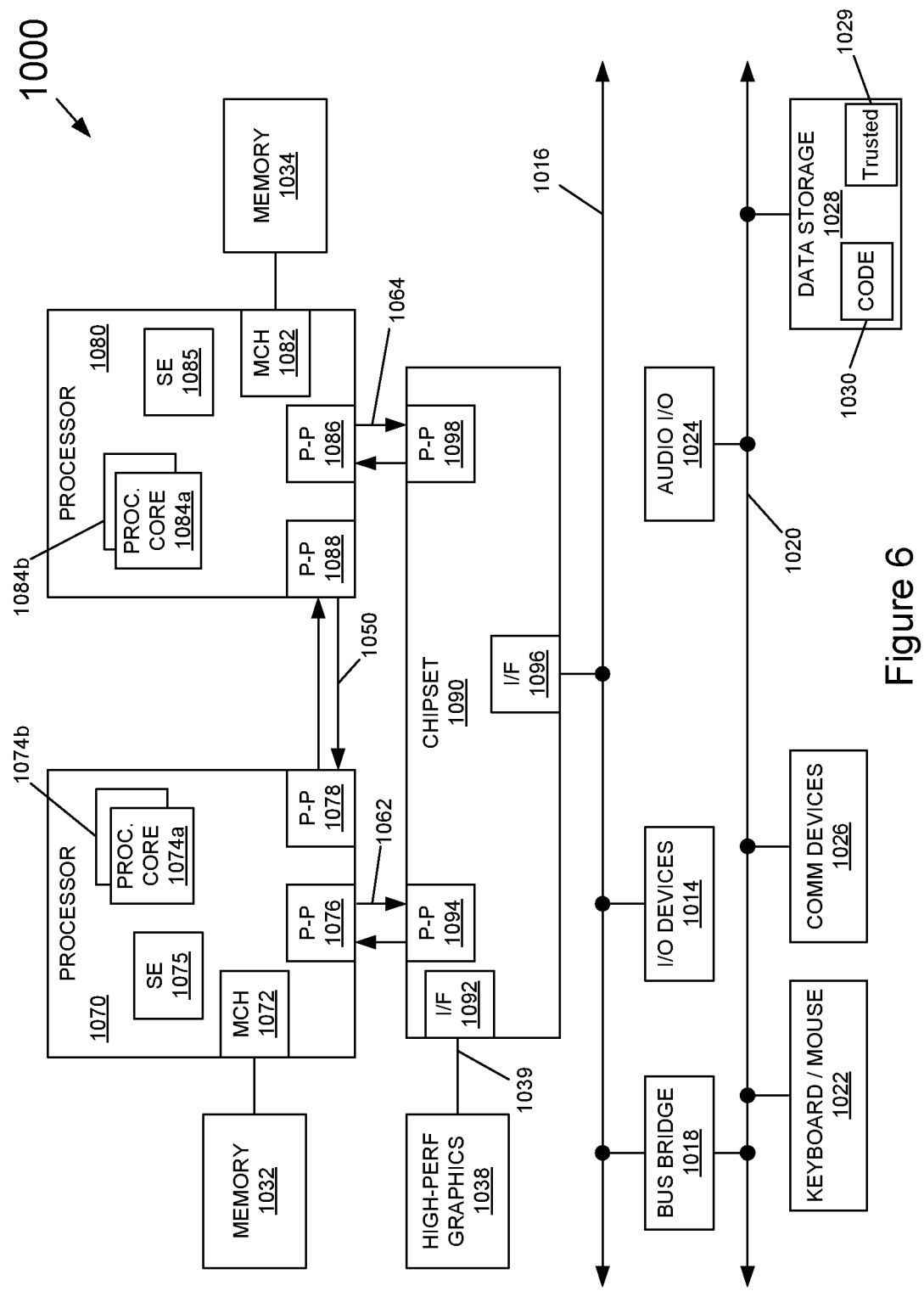

Referring now to FIG. 6, shown is a block diagram of a system in accordance with another embodiment of the present invention. Multiprocessor system 1000 is a point-to-point interconnect system such as a server system, and includes a first processor 1070 and a second processor 1080 coupled via a point-to-point interconnect 1050. Each of processors 1070 and 1080 may be multicore processors (which may include any vertical memory described herein) such as SoCs, including first and second processor cores (i.e., processor cores 1074a and 1074b and processor cores 1084a and 1084b), although potentially many more cores may be present in the processors. In addition, processors 1070 and 1080 each may include a secure engine 1075 and 1085 to perform security operations such as attestations, IoT network onboarding or so forth.

First processor 1070 further includes a memory controller hub (MCH) 1072 and point-to-point (P-P) interfaces 1076 and 1078. Similarly, second processor 1080 includes a MCH 1082 and P-P interfaces 1086 and 1088. MCH's 1072 and 1082 couple the processors to respective memories, namely a memory 1032 and a memory 1034 (which may include any vertical memory described herein), which may be portions of main memory (e.g., a DRAM) locally attached to the respective processors. First processor 1070 and second processor 1080 may be coupled to a chipset 1090 via P-P interconnects 1062 and 1064, respectively. Chipset 1090 includes P-P interfaces 1094 and 1098.

Furthermore, chipset 1090 includes an interface 1092 to couple chipset 1090 with a high performance graphics engine 1038, by a P-P interconnect 1039. In turn, chipset 1090 may be coupled to a first bus 1016 via an interface 1096. Various input/output (I/O) devices 1014 may be coupled to first bus 1016, along with a bus bridge 1018 which couples first bus 1016 to a second bus 1020. Various devices may be coupled to second bus 1020 including, for example, a keyboard/mouse 1022, communication devices 1026 and a data storage unit 1028 (which may include any vertical memory described herein) such as a non-volatile storage or other mass storage device. As seen, data storage unit 1028 may include code 1030, in one embodiment. As further seen, data storage unit 1028 also includes a trusted storage 1029 to store sensitive information to be protected. Further, an audio I/O 1024 may be coupled to second bus 1020.

Figure 7:
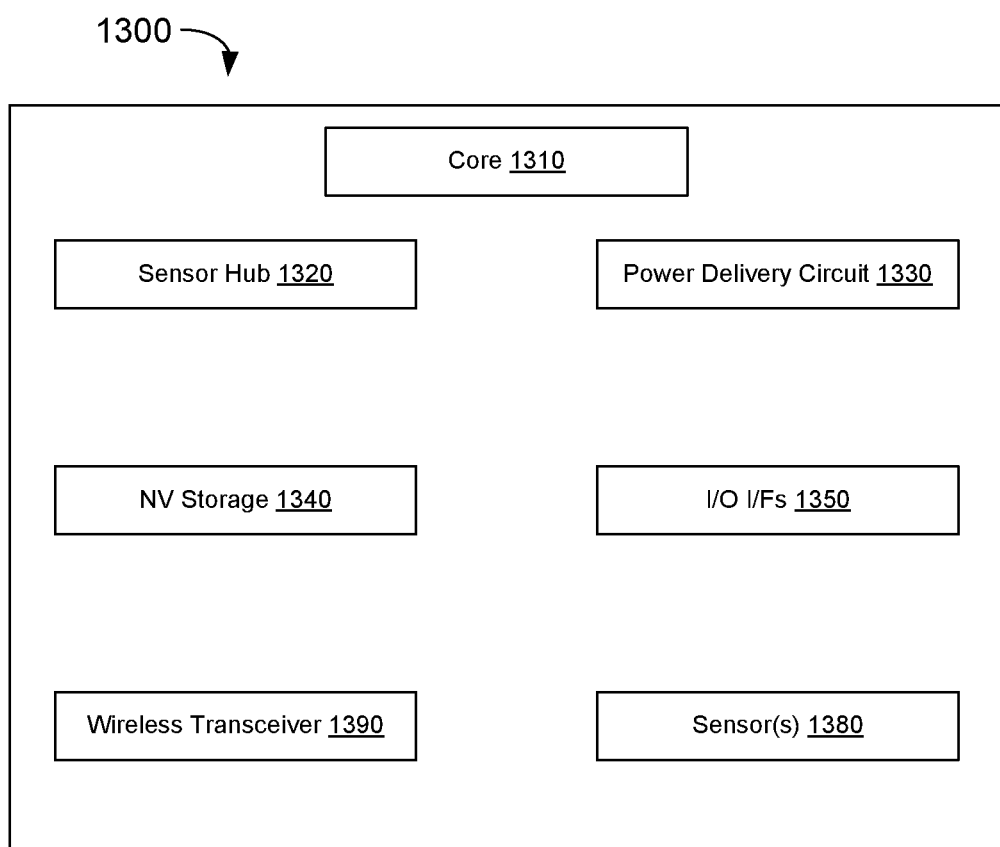

Referring now to FIG. 7, embodiments may be used in environments where IoT devices may include wearable devices or other small form factor IoT devices. Shown is a block diagram of a wearable module 1300 in accordance with another embodiment. In one particular implementation, module 1300 (which may include any vertical memory described herein) may be an Intel® Curie™ module that includes multiple components adapted within a single small module that can be implemented as all or part of a wearable device. As seen, module 1300 includes a core 1310 (of course in other embodiments more than one core may be present). Such core may be a relatively low complexity in-order core, such as based on an Intel Architecture® Quark™ design. In some embodiments, core 1310 may implement a Trusted Execution Environment (TEE). Core 1310 couples to various components including a sensor hub 1320, which may be configured to interact with a plurality of sensors 1380, such as one or more biometric, motion environmental or other sensors. A power delivery circuit 1330 (which may include any vertical memory described herein) is present, along with a non-volatile storage 1340 (which may include any vertical memory described herein). In an embodiment, this circuit may include a rechargeable battery and a recharging circuit, which may in one embodiment receive charging power wirelessly. One or more input/output (IO) interfaces 1350, such as one or more interfaces compatible with one or more of USB/SPI/I2C/GPIO protocols, may be present. In addition, a wireless transceiver 1390, which may be a Bluetooth™ low energy or other short-range wireless transceiver is present to enable wireless communications as described herein. Understand that in different implementations a wearable module can take many other forms. Wearable and/or IoT devices have, in comparison with a typical general purpose CPU or a GPU, a small form factor, low power requirements, limited instruction sets, relatively slow computation throughput, or any of the above.

Figure 8:
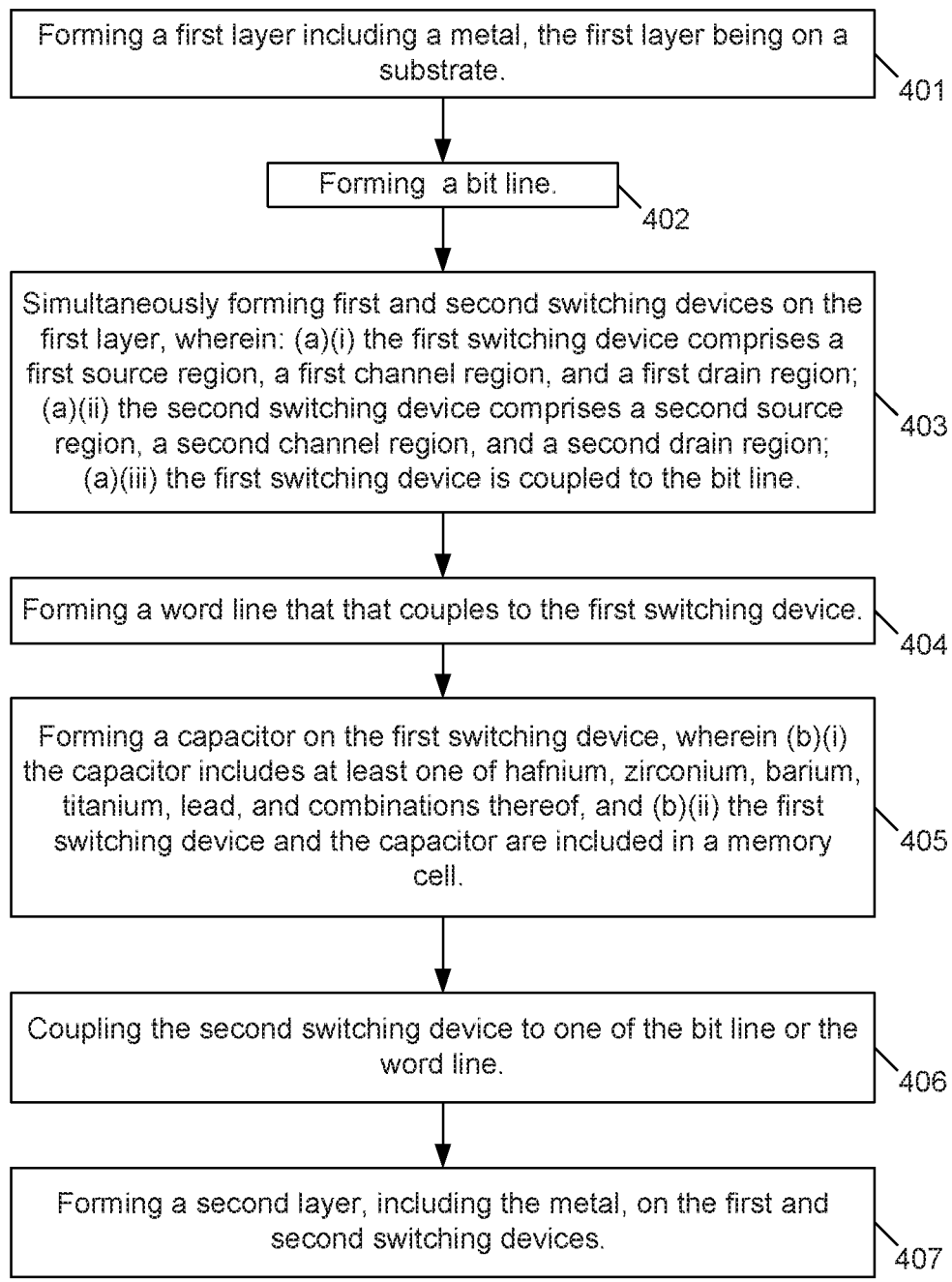
FIG. 8 includes a method in an embodiment.

FIG. 8 includes a method 400 for forming a vertical memory such as the memory 100 of FIG. 1.

However, the method may be practiced with a different sequence of actions. For example, the process may include: (A) forming a first layer including a metal, the first layer being on a substrate, (B) simultaneously forming first and second switching devices on the first layer, wherein: (i) the first switching device comprises a first source region, a first channel region, and a first drain region; (ii) the second switching device comprises a second source region, a second channel region, and a second drain region, (C) forming a capacitor on the first switching device, wherein (i) the capacitor includes at least one of hafnium, zirconium, barium, titanium, lead, and combinations thereof, and (ii) the first switching device and the capacitor are included in a memory cell, (D) forming a bit line that couples to the first switching device, (E) forming a word line that couples to the first switching device, (F) coupling the second switching device to one of the bit line or the word line, (G) forming a second layer, including the metal, on the first and second switching devices.

In an embodiment, the ferroelectric capacitor circuits may be column multiplexed. Further, an N-TYPE pass gate MUX may be used, with a full sense amplifier/precharge circuit implemented on the CMOS substrate below the MUX device that is located in the backend layers.

In an embodiment word line driver circuits and decode circuits can be implemented in the back-end. In an embodiment an array has 512 rows (e.g., 9 address bits). The 3 most significant bit (MSB) row address bits may be pre-decoded to form 8 1-hot decoded group-1 predecode signals. The next 3 row address bits may be predecoded to for 8 1-hot group-2 predecode signals. The 3 least significant bit (LSB) address bits may be pre-decoded to form 8 1-hot group-3 predecode signals. A dynamic NAND and word line driver is used for each word line and each of the 512 combinations of group-1, group-2 and group-3 predecode signals. In an embodiment the group-1 and group-2 signals control NMOS pass-gates that selectively precharge the gate of the N-TYPE word line pull-up transistor. Subsequent to precharging the N-type pull-up gate, an address bit from group-3 couples to the drain terminal. Initially the drain is at VSS and the gate is at VDD-VT. Gate-drain capacitance (CGD) is precharged to VDD-VT. As the drain rises from VSS to VDD, the gate rises from VDD-VT to nearly 2*VDD-VT. In this way, the N-type pull-up transistor is sufficiently over-driven to be an effective pull-up device. Thus, devices such as 101, 102, 103, 104 of array 100 (FIG. 1) may be implemented in NMOS with no CMOS used at the backend level that includes devices 101, 102, 103, 104.

The following examples pertain to further embodiments.

Example 1. A system comprising: a substrate having a surface; a first layer that includes a metal, the first layer being on the substrate; a second layer that includes the metal, the second layer being on the first layer; a first switching device between the first and second layers, the first switching device comprising a first source region, a first channel region, and a first drain region; a second switching device between the first and second layers, the second switching device comprising a second source region, a second channel region, and a second drain region; a capacitor between the first and second layers, the capacitor including oxygen and at least one of hafnium, zirconium, barium, titanium, lead, and combinations thereof; a memory cell that includes the first switching device and the capacitor; an interconnect line that couples the first and second switching devices to each other; wherein: (a) the surface is substantially disposed in a first plane, and (b) a second plane is parallel to the first plane, the second plane intersecting the first and second switching devices.

For example, the first layer may include the bit line. However, the first layer may include some other layer that includes metal, such as a layer including an interconnect line. For example, the second layer may include a common capacitor plate. In such a case the capacitor may include a metal lining, a ferroelectric material, and another metal lining that couples to the capacitor plate. However, the second layer may include some other layer that includes metal, such as a layer including a high metal layer used for power routing and the like. The first and second switching devices may include TFTs but are not limited to TFTs in other embodiments which use other forms of backend transistors.

While some embodiments include TFTs or transistors, other switching devices (e.g., diodes) may be used in other embodiments. Embodiments may use TMD materials such as tungsten di-sulfide and/or tungsten di-selenide. Also, in various embodiments TFTs may include: (a) channel materials such as nickel and oxygen (e.g., NiO) with gate insulator materials silicon and oxygen (e.g., $SiO_2$), (b) channel materials such as copper and oxygen (e.g., $Cu_xO$) with gate insulators such as Scandium and oxygen (e.g., $ScO_x$), (c) channel materials such as tin and oxygen (e.g., SnO) with gate insulators such as silicon and oxygen (e.g., $SiO_2$).

Other embodiments may include a capacitor including oxygen and at least one of (a) bismuth, iron, and oxygen (e.g., $BiFeO_3$), (b) barium, titanium, and oxygen (e.g., $BaTiO_3$), (c) strontium, titanium, and oxygen (e.g., $SrTiO_3$), and (d) barium, strontium, titanium, and oxygen (e.g., BaSrTiO).

Example 2. The system of example 1 comprising a bit line, wherein the bit line is coupled to the interconnect line, the second switching device, and the memory cell.

Example 3. The system of example 2 wherein the bit line is between the first switching device and the substrate.

Example 4. The system of example 3 wherein the capacitor is between the first switching device and the second layer.

Example 5. The system of example 1 comprising a word line, wherein the word line is coupled to the interconnect line, the second switching device, and the memory cell.

Example 6. The system of example 5, wherein the word line is between the first switching device and the second layer.

Example 7. The system of example 1 wherein the second switching device is not included in any memory cell.

Example 8. The system of example 1 comprising a sense amplifier corresponding to the memory cell, wherein the sense amplifier includes the second switching device.

Example 9. The system of example 1 comprising a multiplexor (MUX), wherein: the MUX includes the second switching device; the MUX is to select one of the first switching device or another switching device.

Example 10. The system of example 1 comprising: an additional first switching device between the first switching device and the second layer, the additional first switching device comprising an additional first source region, an additional first channel region, and an additional first drain region; an additional capacitor between the first switching device and the second layer, the additional capacitor including lead, zirconium, and titanium; an additional memory cell that includes the additional first switching device and the additional capacitor; an additional second switching device between the second switching device and the second layer, the additional second switching device comprising an additional second source region, an additional second channel region, and an additional second drain region; an additional interconnect line that couples the additional first switching device to the additional second switching device; wherein a third plane, parallel to the first plane, intersects the additional first switching device and the additional second switching device.

Example 11. The system of example 10 comprising a multiplexor (MUX): the MUX includes the second switching device; the MUX is to select one of the first switching device and the additional first switching device.

Example 12. The system of example 1 comprising: an integrated circuit; a memory comprising the memory cell; and a package housing that includes the integrated circuit and the memory.

Example 13. The system of example 12 wherein the integrated circuit comprises a field programmable gate array (FPGA).

Example 14. The system of example 12 comprising: a radiofrequency receiver; and a chassis; wherein the chassis includes the radiofrequency receiver and the package.

Example 15. The system of example 1, wherein: an axis is orthogonal to the first plane; the axis intersects the substrate, the first layer, the first switching device, and the second layer.

Example 16. The system of example 15, wherein the axis intersects the first channel and at least one of the first source or the first drain.

Example 17. The system of example 16 wherein the axis intersects the capacitor.

Example 18. The system of example 1 wherein: the first switching device is an NMOS transistor; the second switching device is another NMOS transistor; the first and second switching devices are included in a layer: the layer does not include a PMOS transistor.

Example 19. The system of example 1 wherein: the first switching device is a PMOS transistor; the second switching device is another PMOS transistor; the first and second switching devices are included in a layer: the layer does not include an NMOS transistor.

Example 20. The system of example 1 comprising an additional component, wherein: the additional component includes at least one of an additional capacitor or an additional switching device; the memory cell includes the additional component.

Example 21. The system of example 1 comprising a bit line and a word line, wherein: the second switching device is coupled to one of the bit line or the world line; one of the word line and the bit line is between the first switching device and the substrate; another of the word line and the bit line is between the first switching device and second layer; the word line and the bit line both couple to the memory cell.

Example 22. The system of example 1 wherein: the first switching device includes a dielectric material; the second switching device includes the dielectric material; the first channel region includes a semiconductor material; the second channel region includes the semiconductor material.

Example 23. A system comprising: a substrate having a surface; a layer, including a metal, on the substrate; a first switching device between the layer and the substrate, the first switching device comprising a first source region, a first channel region, and a first drain region; a capacitor between the first switching device and the layer, the capacitor including a ferroelectric material; a memory cell that includes the first switching device and the capacitor; a second switching device between the layer and the substrate, the second switching device comprising a second source region, a second channel region, and a second drain region; a bit line coupled to one of the first source region and the first drain region; a word line coupled to the first gate region; wherein the second switching device is not included in any memory cell.

Example 24. The system of example 23 wherein: the second switching device is included in a multiplexor (MUX); the surface is substantially disposed in a first plane; a second plane is parallel to the first plane, the second plane intersecting the first and second switching devices.

Example 25. The system of example 23 wherein: the ferroelectric material includes oxygen; the ferroelectric material includes at least one of hafnium, zirconium, barium, titanium, lead, and combinations thereof.

Example 26. A method comprising; forming a first layer including a metal, the first layer being on a substrate; simultaneously forming first and second switching devices on the first layer, wherein: (a)(i) the first switching device comprises a first source region, a first channel region, and a first drain region; (a)((ii) the second switching device comprises a second source region, a second channel region, and a second drain region; forming a capacitor on the first switching device, wherein (b)(i) the capacitor includes at least one of hafnium, zirconium, barium, titanium, lead, and combinations thereof, and (b)(ii) the first switching device and the capacitor are included in a memory cell; forming a bit line that couples to the first switching device; forming a word line the that couples to the first switching device; coupling the second switching device to one of the bit line or the word line; forming a second layer, including the metal, on the first and second switching devices; wherein a surface of the substrate is substantially disposed in a first plane; and wherein a second plane, parallel to the first plane, intersects the first and second switching devices.

The order of elements may vary from that listed in Example 26. For instance, the word line or bit line may be formed before or after forming the first switching device. The first layer may include the bit line and/or the word line.

Example 27. The method of example 26 wherein the second switching device is included in a multiplexor (MUX).

Example 1a. A system comprising: a substrate having a surface; a first layer that includes a metal, the first layer being on the substrate; a second layer that includes the metal, the second layer being on the first layer; a first switching device between the first and second layers, the first switching device comprising a first source region, a first channel region, and a first drain region; a second switching device between the first and second layers, the second switching device comprising a second source region, a second channel region, and a second drain region; a capacitor between the first and second layers, the capacitor including oxygen and at least one of hafnium, zirconium, barium, titanium, lead, or combinations thereof; a memory cell that includes the first switching device and the capacitor; an interconnect line that couples the first and second switching devices to each other; wherein: (a) the surface is substantially disposed in a first plane, and (b) a second plane is parallel to the first plane, the second plane intersecting the first and second switching devices.

Another version of Example 1a. A system comprising: a substrate having a surface; a first layer that includes a metal, the first layer being on the substrate; a second layer that includes the metal, the second layer being on the first layer; a first means for switching between the first and second layers, the first means for switching comprising a first source region; a second means for switching between the first and second layers, the second means for switching comprising a second source region; a capacitor between the first and second layers, the capacitor including oxygen and at least one of hafnium, zirconium, barium, titanium, lead, or combinations thereof; a memory cell that includes the first means for switching and the capacitor; an interconnect line that couples the first and second means for switching to each other; wherein: (a) the surface is substantially disposed in a first plane, and (b) a second plane is parallel to the first plane, the second plane intersecting the first and second means for switching.

Example 2a. The system of example 1a comprising a bit line, wherein the bit line is coupled to the interconnect line, the second switching device, and the memory cell.

Example 3a. The system of example 2a wherein the bit line is between the first switching device and the substrate.

Example 4a. The system according to any of examples 1a-3a wherein the capacitor is between the first switching device and the second layer.

Example 5a. The system according to any of examples 1a-4a comprising a word line, wherein the word line is coupled to the interconnect line, the second switching device, and the memory cell.

Example 6a. The system of example 5a, wherein the word line is between the first switching device and the second layer.

Example 7a. The system according to any of examples 1a-6a wherein the second switching device is not included in any memory cell.

Example 8a. The system according to any of examples 1a-7a comprising a sense amplifier corresponding to the memory cell, wherein the sense amplifier includes the second switching device.

Another version of Example 8a. The system according to any of examples 1a-7a comprising a means for sensing corresponding to the memory cell, wherein the means for sensing includes the second switching device.

Example 9a. The system according to any of examples 1a-7a comprising a multiplexor (MUX), wherein: the MUX includes the second switching device; the MUX is to select one of the first switching device or a third switching device, the third switching device being included in an additional memory cell.

Another version of Example 9a. The system according to any of examples 1a-7a comprising a means for selecting, wherein: the means for selecting includes the second switching device; the means for selecting is to select one of the first switching device or a third switching device, the third switching device being included in an additional memory cell.

Example 10a. The system according to any of examples 1a-9a comprising: an additional first switching device between the first switching device and the second layer, the additional first switching device comprising an additional first source region, an additional first channel region, and an additional first drain region; an additional capacitor between the first switching device and the second layer, the additional capacitor including oxygen and at least one of hafnium, zirconium, barium, titanium, lead, or combinations thereof; an additional memory cell that includes the additional first switching device and the additional capacitor; an additional second switching device between the second switching device and the second layer, the additional second switching device comprising an additional second source region, an additional second channel region, and an additional second drain region; wherein a third plane is parallel to the first plane, the third plane intersecting the additional first switching device and the additional second switching device; wherein a first axis is orthogonal to the first plane, the first axis intersecting the first switching device and the additional first switching device; wherein a second axis is orthogonal to the first plane, the second axis intersecting the second switching device and the additional second switching device.

Example 11a. The system of example 10a comprising a multiplexor (MUX), wherein: the MUX includes the second switching device; the MUX is to select one of the first switching device or the additional first switching device.

Example 12a. The system according to any of examples 1a-11a comprising: an integrated circuit on a first die; a memory on a second die, the memory comprising the memory cell; the first die and the second die both on a package substrate.

Example 13a. The system of example 12a wherein the integrated circuit comprises a field programmable gate array (FPGA).

Example 14a. The system of example 12a comprising: a radiofrequency receiver; and a chassis; wherein the chassis includes the radiofrequency receiver and the package substrate.

Example 15a. The system according to any of examples 1a-14a, wherein: an axis is orthogonal to the first plane; the axis intersects the substrate, the first layer, the first switching device, and the second layer.

Example 16a. The system of example 15a, wherein the axis intersects the first channel and at least one of the first source or the first drain.

Example 17a. The system according to any of examples 1a-16a wherein: the first switching device is an NMOS transistor; the second switching device is another NMOS transistor; the first and second switching devices are included in a layer: the layer does not include a PMOS transistor.

Example 18a. The system according to any of examples 1a-16a wherein: the first switching device is a PMOS transistor; the second switching device is another PMOS transistor; the first and second switching devices are included in a layer: the layer does not include an NMOS transistor.

Example 19a. The system according to any of examples 1a-18a comprising an additional component, wherein: the additional component includes at least one of an additional capacitor or an additional switching device; the memory cell includes the additional component.

Example 20a. The system according to any of examples 1a, 4a, 7a-19a comprising a bit line and a word line, wherein: the second switching device is coupled to one of the bit line or the word line; one of the word line or the bit line is between the first switching device and the substrate; another of the word line or the bit line is between the first switching device and the second layer; the word line and the bit line both couple to the memory cell.

Example 21a. The system according to any of examples 1a-20a wherein: the first switching device includes a dielectric material; the second switching device includes the dielectric material; the first channel region includes a semiconductor material; the second channel region includes the semiconductor material.

Example 22a. A system comprising: a substrate having a surface; a layer, including a metal, on the substrate; a first switching device between the layer and the substrate, the first switching device comprising a first source region, a first channel region, and a first drain region; a capacitor between the first switching device and the layer, the capacitor including a ferroelectric material; a memory cell that includes the first switching device and the capacitor; a second switching device between the layer and the substrate, the second switching device comprising a second source region, a second channel region, and a second drain region; a bit line coupled to one of the first source region or the first drain region; a word line coupled to the first gate region; wherein the second switching device is not included in any memory cell.

Example 23a. The system of example 22a wherein: the second switching device is included in a multiplexor (MUX); the surface is substantially disposed in a first plane; a second plane is parallel to the first plane, the second plane intersecting the first and second switching devices.

Example 24a. The system according to any of examples 22a-23a wherein: the ferroelectric material includes oxygen; the ferroelectric material includes at least one of hafnium, zirconium, barium, titanium, lead, or combinations thereof.

Example 25a. A method comprising; forming a first layer including a metal, the first layer being on a substrate; forming a bit line; simultaneously forming first and second switching devices on the first layer, wherein: (a)(i) the first switching device comprises a first source region, a first channel region, and a first drain region; (a)((ii) the second switching device comprises a second source region, a second channel region, and a second drain region; coupling the first switching device to the bit line; forming a word line the that couples to the first switching device; forming a capacitor on the first switching device, wherein (b)(i) the capacitor includes at least one of hafnium, zirconium, barium, titanium, lead, or combinations thereof, and (b)(ii) the first switching device and the capacitor are included in a memory cell; coupling the second switching device to one of the bit line or the word line; forming a second layer, including the metal, on the first and second switching devices; wherein a surface of the substrate is substantially disposed in a first plane; and wherein a second plane, parallel to the first plane, intersects the first and second switching devices.

Example 26a. The method of example 25a wherein the second switching device is included in a multiplexor (MUX).

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A system comprising:
   a substrate having a surface;
   a first layer that includes a metal, the first layer being on the substrate;
   a second layer that includes the metal, the second layer being on the first layer;
   a first switching device between the first and second layers, the first switching device comprising a first source region, a first channel region, and a first drain region;
   a second switching device between the first and second layers, the second switching device comprising a second source region, a second channel region, and a second drain region;
   a capacitor between the first and second layers, the capacitor including oxygen and at least one of hafnium, zirconium, barium, titanium, lead, or combinations thereof;
   a memory cell that includes the first switching device and the capacitor;
   an interconnect line that couples the first and second switching devices to each other;
   wherein: (a) the surface is substantially disposed in a first plane, (b) a second plane is parallel to the first plane, the second plane intersecting the first and second switching devices; and (c) the second switching device is not included in any memory cell.

2. The system of claim 1 comprising a bit line, wherein the bit line is coupled to the interconnect line, the second switching device, and the memory cell.

3. The system of claim 2 wherein the bit line is between the first switching device and the substrate.

4. The system of claim 3 wherein the capacitor is between the first switching device and the second layer.

5. The system of claim 1 comprising a word line, wherein the word line is coupled to the interconnect line, the second switching device, and the memory cell.

6. The system of claim 5, wherein the word line is between the first switching device and the second layer.

7. The system of claim 1 comprising a sense amplifier corresponding to the memory cell, wherein the sense amplifier includes the second switching device.

8. The system of claim 1 comprising a multiplexor (MUX), wherein:
   the MUX includes the second switching device;
   the MUX is to select one of the first switching device or a third switching device, the third switching device being included in an additional memory cell.

9. The system of claim 1 comprising:
   an additional first switching device between the first switching device and the second layer, the additional first switching device comprising an additional first source region, an additional first channel region, and an additional first drain region;
   an additional capacitor between the first switching device and the second layer, the additional capacitor including oxygen and at least one of hafnium, zirconium, barium, titanium, lead, or combinations thereof;
   an additional memory cell that includes the additional first switching device and the additional capacitor;
   an additional second switching device between the second switching device and the second layer, the additional second switching device comprising an additional second source region, an additional second channel region, and an additional second drain region;
   wherein a third plane is parallel to the first plane, the third plane intersecting the additional first switching device and the additional second switching device;
   wherein a first axis is orthogonal to the first plane, the first axis intersecting the first switching device and the additional first switching device;
   wherein a second axis is orthogonal to the first plane, the second axis intersecting the second switching device and the additional second switching device.

10. The system of claim 9 comprising a multiplexor (MUX), wherein:
    the MUX includes the second switching device;
    the MUX is to select one of the first switching device or the additional first switching device.

11. The system of claim 1 comprising:
    an integrated circuit on a first die;
    a memory on a second die, the memory comprising the memory cell;
    the first die and the second die both on a package substrate.

12. The system of claim 11 wherein the integrated circuit comprises a field programmable gate array (FPGA).

13. The system of claim 11 comprising:
    a radiofrequency receiver; and a chassis;
wherein the chassis includes the radiofrequency receiver and the package substrate.

14. The system of claim 1, wherein:
an axis is orthogonal to the first plane;
the axis intersects the substrate, the first layer, the first switching device, and the second layer.

15. The system of claim 14, wherein the axis intersects the first channel and at least one of the first source or the first drain.

16. The system of claim 1 wherein:
the first switching device is an NMOS transistor;
the second switching device is another NMOS transistor;
the first and second switching devices are included in a layer:
the layer does not include a PMOS transistor.

17. The system of claim 1 wherein:
the first switching device is a PMOS transistor;
the second switching device is another PMOS transistor;
the first and second switching devices are included in a layer:
the layer does not include an NMOS transistor.

18. The system of claim 1 comprising an additional component, wherein:
the additional component includes at least one of an additional capacitor or an additional switching device;
the memory cell includes the additional component.

19. The system of claim 1 comprising a bit line and a word line, wherein:
the second switching device is coupled to one of the bit line or the word line;
one of the word line or the bit line is between the first switching device and the substrate;
another of the word line or the bit line is between the first switching device and the second layer;
the word line and the bit line both couple to the memory cell.

20. The system of claim 1 wherein:
the first switching device includes a dielectric material;
the second switching device includes the dielectric material;
the first channel region includes a semiconductor material;
the second channel region includes the semiconductor material.

21. A system comprising:
a substrate having a surface;
a layer, including a metal, on the substrate;
a first switching device between the layer and the substrate, the first switching device comprising a first source region, a first channel region, and a first drain region;
a capacitor between the first switching device and the layer, the capacitor including a ferroelectric material;
a memory cell that includes the first switching device and the capacitor;
a second switching device between the layer and the substrate, the second switching device comprising a second source region, a second channel region, and a second drain region;
a bit line coupled to one of the first source region or the first drain region;
a word line coupled to the first gate region;
wherein the second switching device is not included in any memory cell.

22. The system of claim 21 wherein:
the second switching device is included in a multiplexor (MUX);
the surface is substantially disposed in a first plane;
a second plane is parallel to the first plane, the second plane intersecting the first and second switching devices.

23. The system of claim 21 wherein:
the ferroelectric material includes oxygen;
the ferroelectric material includes at least one of hafnium, zirconium, barium, titanium, lead, or combinations thereof.

24. A method comprising;
forming a first layer including a metal, the first layer being on a substrate; forming a bit line;
simultaneously forming first and second switching devices on the first layer, wherein: (a)(i) the first switching device comprises a first source region, a first channel region, and a first drain region; (a)((ii) the second switching device comprises a second source region, a second channel region, and a second drain region;
coupling the first switching device to the bit line;
forming a word line the that couples to the first switching device;
forming a capacitor on the first switching device, wherein (b)(i) the capacitor includes at least one of hafnium, zirconium, barium, titanium, lead, or combinations thereof, and (b)(ii) the first switching device and the capacitor are included in a memory cell;
coupling the second switching device to one of the bit line or the word line;
forming a second layer, including the metal, on the first and second switching devices;
wherein a surface of the substrate is substantially disposed in a first plane; and
wherein a second plane, parallel to the first plane, intersects the first and second switching devices;
wherein the second switching device is not included in any memory cell.

25. The method of claim 24 wherein the second switching device is included in a multiplexor (MUX).

* * * * *